United States Patent

Matsukura et al.

[15] 3,651,348

[45] Mar. 21, 1972

[54] SEMICONDUCTOR LOGIC DEVICE EMPLOYING THE GUNN EFFECT ELEMENT

[72] Inventors: Yasuo Matsukura; Toshio Wada; Kuniichi Ohta, all of Tokyo, Japan

[73] Assignee: Nippon Electric Company, Limited, Tokyo, Japan

[22] Filed: Oct. 3, 1969

[21] Appl. No.: 863,566

[30] Foreign Application Priority Data

Oct. 7, 1968 Japan....................................43/73365

[52] U.S. Cl...............................307/299, 307/203, 307/272, 331/107 G

[51] Int. Cl.........................................................H03k 19/08

[58] Field of Search...............................331/107 G; 307/299

[56] References Cited

UNITED STATES PATENTS 3,451,011 6/1969 Uenohara..........................331/107 G

OTHER PUBLICATIONS

Sugeta et al., " Proc. of IEEE," Feb. 1968, pp. 239–240

McGroddy et al., " IBM Technical Bulletin," Aug. 1968, p. 237

*Primary Examiner*—Roy Lake

*Assistant Examiner*—Darwin R. Hostetter

*Attorney*—Sandoe, Hopgood and Calimafde

[57] ABSTRACT

A logic device comprises a Gunn effect element having a capacitive element connected across its electrodes. The Gunn effect element is normally biased below the threshold value, and an input pulse is applied to raise the internal field of the Gunn effect element above the threshold value. The resultant charging of the capacitive element causes the Gunn effect element to be maintained in a state of oscillation.

5 Claims, 7 Drawing Figures

*INVENTORS*
YASUO MATSUKURA
TOSHIO WADA
KUNIICHI OHTA
by
Sandoe, Hopgood & Calimafde
ATTORNEYS INVENTORS
YASUO MATSUKURA
TOSHIO WADA
KUNIICHI OHTA
by
Sandoe, Hopgood & Calimafde
ATTORNEYS

SEMICONDUCTOR LOGIC DEVICE EMPLOYING THE GUNN EFFECT ELEMENT

This invention relates to a logic device employing Gunn effect elements in which a high electric field dipole layer (hereinafter referred to as high field domain) is produced as a result of the bulk negative resistance effect when the internal electric field exceeds the threshold value.

A Gunn effect element suitable for use as a high speed logic device is disclosed in U. S. Pat. No. 3,365,583. As is described in this patent, various circuits, such as high frequency generator and logic circuits (AND, OR) can be formed of a Gunn effect element. The conventional logic device employing a Gunn effect element utilizes the nature of the high field domain produced by an input triggering pulse, and permits high speed operation. However, the conventional Gunn element is not complete in its logic function in that it is defective in one important function—the memory. In order for the device of this type to have the property of memory, it should have the capability of maintaining a high frequency oscillation state in which a high field domain is produced repeatedly in the Gunn effect element over a finite period of time.

An object of this invention is therefore to provide a logic device employing Gunn effect elements capable of controllably maintaining high frequency oscillation.

The logic device according to this invention comprises a Gunn effect element capable of producing a high field domain in response to the internal electric field exceeding the threshold value a capacitive element connected in parallel to the Gunn effect element across its two electrodes, a power source connected across the electrodes of the Gunn effect element through a resistive element so as to supply the Gunn effect element with an internal field below the threshold value; and an input pulse source for intensifying the internal field to a value above the threshold value to control the generation of the high field domain. The logic device is capable of letting the Gunn effect element maintain the above-the-threshold field by charging the capacitive element, thereby letting the Gunn effect element be maintained in an oscillation state.

Figure 1:
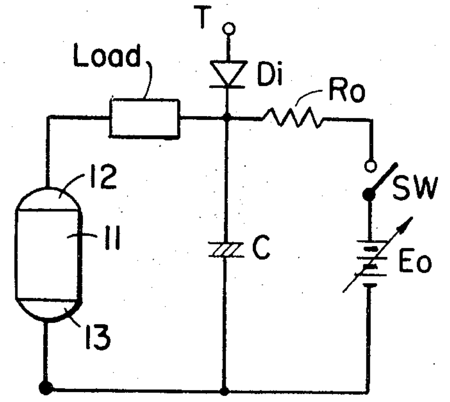
Figure 3:
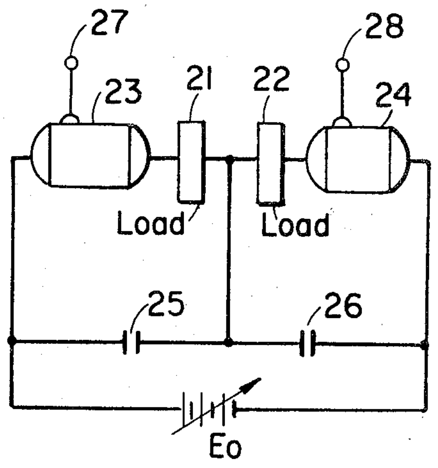
Figure 2:
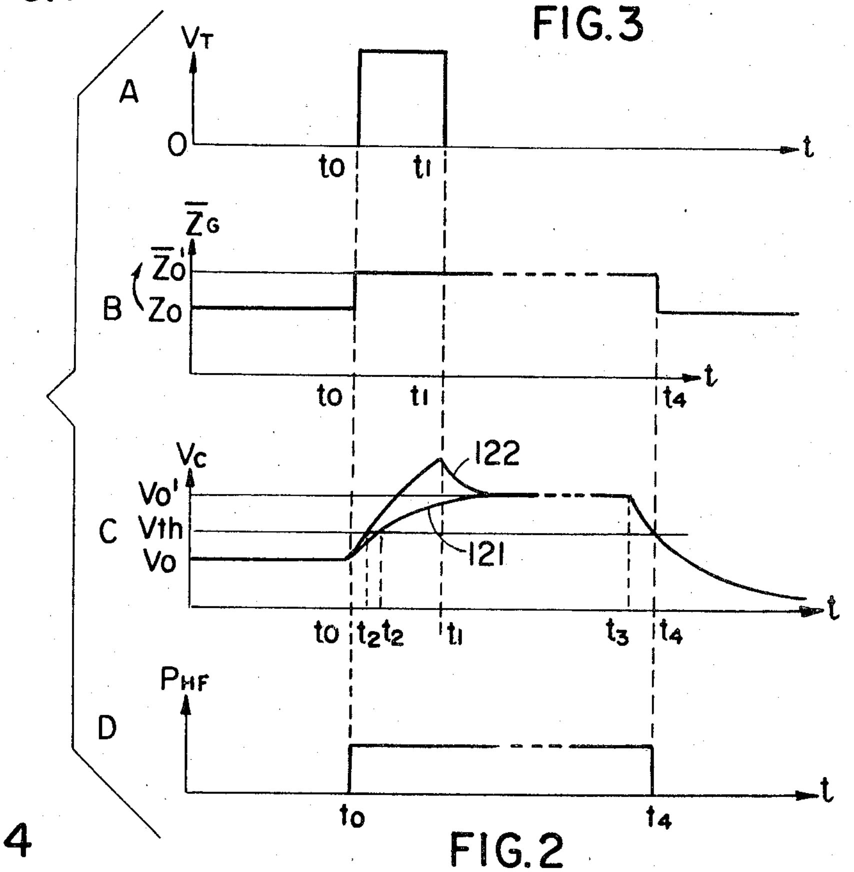
Figure 4:
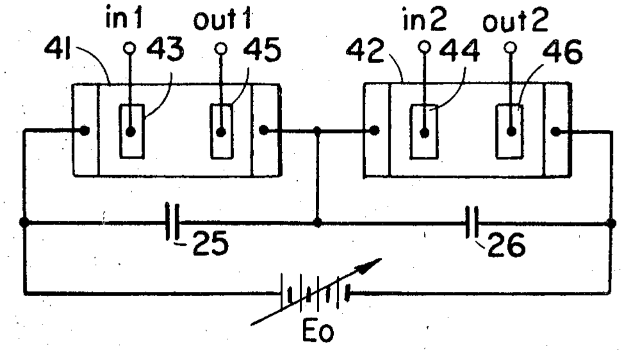
Figure 6:
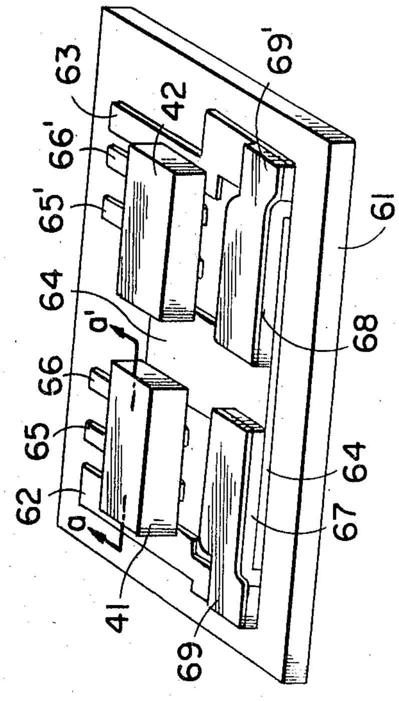
Figure 7:
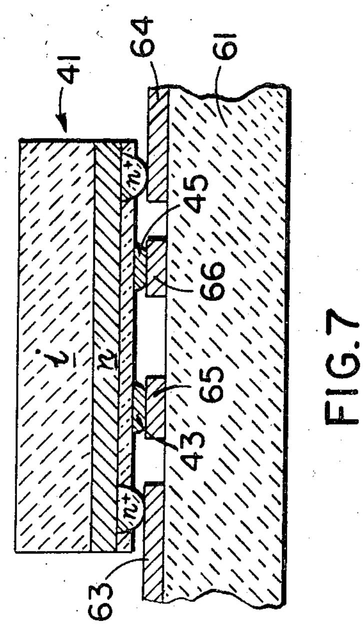
Figure 5:
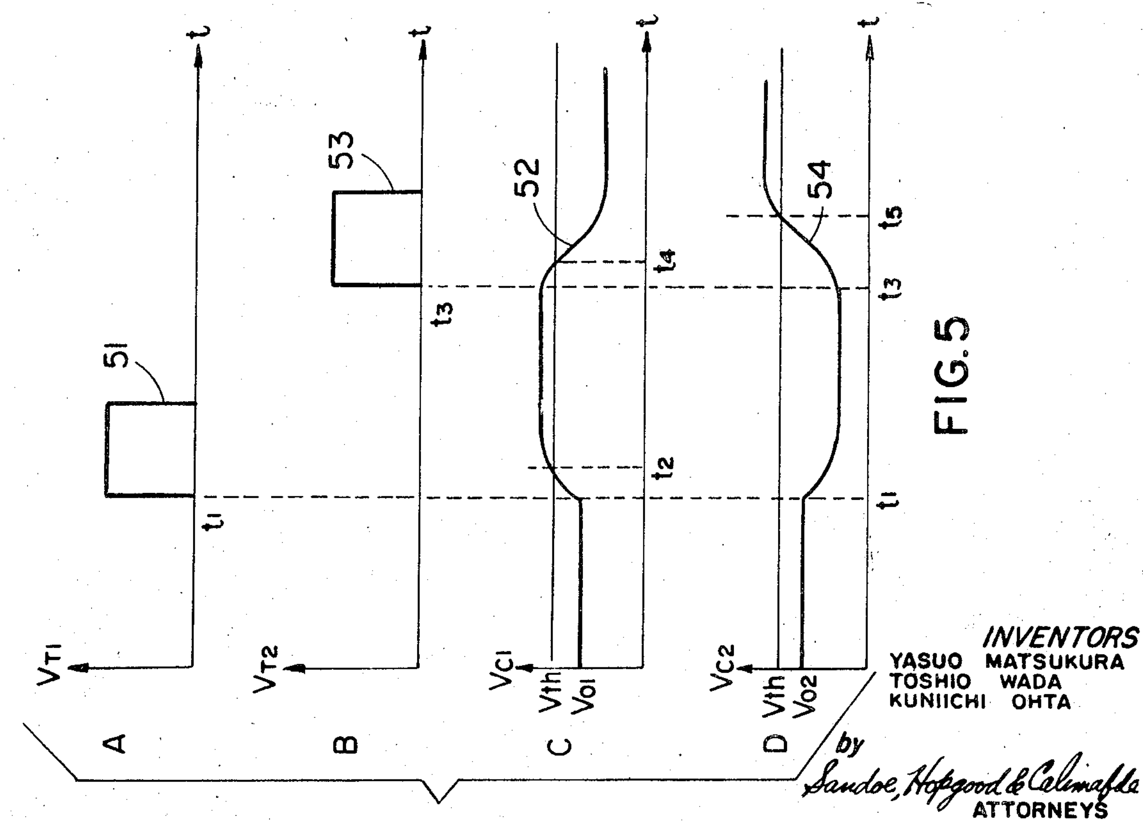

Now the invention will be described in detail in conjunction with the accompanying drawings; in which, FIG. 1 is a circuit diagram of a first embodiment of the invention, FIGS. 2(A) through 2(D) are graphs illustrating the operation of the embodiment of this invention shown in FIG. 1, FIG. 3 is a circuit diagram of a second embodiment of the invention, FIG. 4 is a circuit diagram of a third embodiment of the invention, FIGS. 5(A) through 5(D) are graphs illustrating the operation of the second and third embodiments shown in FIGS. 2 and 3, FIG. 6 is a schematic view of a modification of the embodiment shown in FIG. 4, and FIG. 7 is a sectional view taken across the line *a—a'* of FIG. 6 in the direction of the arrows.

The circuit of FIG. 1 comprises a Gunn effect element 11 having an anode 12 and a cathode 13. A resonant load whose DC impedance is substantially zero, a resistor $Ro$, a switch SW, and a power source $Eo$ form a series circuit with element 11, and a capacitive element $c$ is connected in parallel across the two electrodes of the Gunn effect element 11. A positive input pulse is supplied to a trigger input terminal $T$ connected to the junction of the load and the resistance $Ro$ through a diode $Di$. The Gunn effect element 11 is biased to a voltage determined by the values of power source $Eo$, and the resistor $Ro$, so that its internal field is maintained at a value which approximates to but does not exceed the threshold value. The threshold value of the Gunn effect element employing n-type gallium arsenide is about 3.0 kv./cm., although this value varies greatly depending upon the impurity density of the element. The internal field of the Gunn effect element is intensified temporarily to an above-the-threshold value by the input pulse applied to the trigger terminal T, which produces a high field domain attributable to the bulk effect in the vicinity of the cathode 13. When the high field domain is produced, the internal impedance of the Gunn effect element increases. This increased impedance state is maintained until the high field domain reaches the anode 12 and vanishes there. Due to this increase in impedance, the current flowing in the Gunn effect element is reduced during this period. In general, the value of the current flowing in the Gunn effect element is reduced by 30 to 50 percent due to the growth of the high field domain. When the high field domain vanishes at the anode, it is possible to repeat the generation of the high field domain in the element to which the input pulse is successively applied, or in which the voltage applied across the anode 12 and cathode 13 is kept high. If the internal field of the Gunn effect element 11 exceeds the threshold value, a high field domain is produced again in the vicinity of the cathode 13 within a very short period of time, e.g., about $10^{-9}$ second. The capacitive element $C$ charges up to a voltage which is determined by the respective resistances of and resistor $Ro$ and Gunn effect element 11, and the power source $Eo$, and is kept in the charged state until it is discharged through the Gunn effect element 11 and the high field layer vanishes. The charged and discharged states of capacitive element $C$ can be expressed as an exponential function having the time constant factor determined by resistor $Ro$, capacitive element $C$ and the impedance of the Gunn effect element 11. More specifically, so long as the voltage applied across the Gunn effect element 11 is higher than the threshold value, the high frequency oscillation is maintained, with the mean impedance of the Gunn effect element 11 being maintained at a value approximately 40 percent higher than the non-oscillation-state impedance. Therefore, the terminal voltage $Vc$ of the capacitive element C is raised to a value, which is higher than the non-oscillation-state value and which is given by $$Vc \approx 1.4Eo \cdot Zo / 1.4Zo + Ro$$

where $Eo$ denotes the output voltage of the power source denotes and $Zo$, the impedance of the Gunn effect element 11 in the non-oscillation state. When the increased voltage $Vc$ across the capacitive element $C$ is above the threshold value, and at the same time the internal electric field of the Gunn effect element is increased to a value higher than the threshold value for a short period of time after the high field domain vanishes, it becomes possible to maintain periodic production and extinction of the high field layer (hereinafter referred to as the oscillation state). In the logic circuit FIG. 1 the relationship among the threshold electric field intensity $E_{th}$, length L of the n-type gallium arsenide sample of the Gunn effect element, impedance $Zo$, output voltage $Eo$ of the power source, resistance $Ro$, and the constant $K$ representing the ratio between the life time of the high field domain and its interval is given by $$K \cdot 1.4Eo \cdot Zo/(1.4Zo) + Ro > E_{th} \cdot L > Eo \cdot Zo/Zo + Ro$$

In other words, a capacitive element of capacity sufficient enough to bias the Gunn effect element to the above-the-threshold field intensity during the short period from extinction to generation of the high field domain is connected in parallel with the Gunn effect element.

The operation of the foregoing embodiment of the invention is illustrated in FIGS. 2(A) through 2(D) wherein the abscissa represents time $t$, and the ordinates respectively show the trigger pulse voltage $V_T$, mean impedance $\bar{Z}_G$ of the Gunn effect element, terminal voltage $V_C$ across the capacitive element, and high frequency output $P_{HF}$ indicating the oscillation state of the Gunn effect element. The Gunn effect element is biased to a voltage lower than the threshold value $V_{th}$ by the power source $Eo$, switching element SW and resistor $Ro$. Under this state, the capacitive element $C$ is charged to a voltage lower than the threshold value. When the trigger input pulse $V_T$ is applied to the trigger terminal $T$ for the period ranging from time point $t_0$ to $t_1$, with the Gunn effect element biased to a voltage higher than the threshold value, the Gunn effect element is placed in the oscillation state, and its average impedance $\bar{Z}_G$ is increased from the direct current impedance Zo to the oscillation state impedance Zo', which appears along with the bulk effect. With this impedance increase, the capacitive element is charged, and the voltage $V_C$ across the capacitive element $C$ is exponentially increased from the steady bias voltage $Vo$ to a higher voltage $Vo'(\approx K \cdot 1.4 \cdot Eo \cdot Zo/1.4 \cdot Zo+Ro)$, as shown by the curves 121 and 122 in FIG. 2C. The curve 21 shows the variation in the voltage $V_C$ at the low trigger voltage; and the curve 22, shows that variation at the high trigger voltage. When the voltage $V_C$ across the capacitive element $C$ is increasing, at time point $t_2$, voltage $V_C$ exceeds the threshold voltage $V_{th}$ $(=E_{th} \cdot L)$ of the Gunn effect element. The capacitive element $C$ is charged and discharged each time the high field domain grows and vanishes in the Gunn effect element even after the input trigger pulse has been restored to zero at time $t_1$. Thus, the voltage $V_C$ is maintained at a value exceeding the threshold value $V_{th}$. At the time $t_3$, the power source $Eo$ is disconnected from the circuit by the switching element SW whereby the charging function is removed. As a result, the voltage $V_C$ is reduced exponentially depending on the time constant determined by the impedance of the Gunn effect element and the capacitive element. At the time $t_4$, the voltage $V_C$ becomes again equal to the threshold voltage $V_{th}$. Accordingly, after the time point $t_4$, generation of the high field domain in the Gunn effect element is discontinued, and the internal impedance $Z_G$ becomes the steady impedance Zo. In these operations, the high frequency output $P_{HF}$ emerging from the Gunn effect element is obtained during the time period ranging from $t_0$ to $t_4$ as shown in FIG. 2(D).

In the above operation, the relationship among the trigger voltage $V_T$, time width $T$ of the trigger pulse, capacity c of the capacitive element C, threshold voltage $V_{th}$, the oscillation-initiating bias voltage $Vo$, resistance $Ro$, and length $L$ along which the high field domain propagates in the Gunn effect element, is given by $$T \propto \frac{C(V_{th}-Vo)\cdot Ro}{L \cdot V_T}$$

Practically, the individual values of the above elements used for the purpose of this invention are determined in consideration of their mutual relationship. For a Gunn effect element made of gallium arsenide and being several hundred microns in length, the desirable minimum value of the capacitive C would be several picofarad. The sufficient capacitance exceeding a value, e.g., 0.1 microfarad, stabilizes the circuit operation but the transit time is made unavoidably long. Thus, the capacitance suitable for the usual Gunn effect element is selected in the range of several tons of picofarad to a thousand picofarad. Moreover, the impedance of the load Ro is selected to be in the range of about 1 to 2 times the direct current impedance of the Gunn effect element to obtain the desirable sensitivity of the logic circuit.

Fig. 3 shows a logic circuit of the second embodiment of this invention in which, first and second Gunn effect elements 23 and 24 are connected in series by the respective resonant loads 21 and 22 and coupled to the power source $Eo$. A first capacitive element 25 shunts the series connection of the Gunn element 23 and load 21, while a second capacitance element 26 shunts that of Gunn element 24 and load 22. Gunn effect elements 23 and 24 have respective trigger input electrodes 27 and 28. The function of these triggering electrodes is described in the above-mentioned U.S. Patent.

In this embodiment, each of the first circuit consisting of the Gunn effect element 23, load 21 and capacitive element 25, and the second circuit consisting of the Gunn effect element 24, load 22 and capacitive element 26, has the oscillation-maintaining function as described in the first embodiment. Also, the first circuit serves as the external impedance for the second circuit and vice versa. In operation, a bias voltage is supplied from the power source $Eo$ to the Gunn effect elements as will not cause the two Gunn element to oscillate concurrently. An input trigger pulse is applied to that one of the Gunn effect elements which is not in the oscillation state, thereby causing that Gunn effect to oscillate and its internal impedance is thus increased. As a result, the voltage across the other Gunn effect element is decreased to below-the-threshold value, to stop a oscillation. It becomes possible therefore to realize the trigger-type flip-flop or reset-set-type flip-flop which has the bistable state in which the two states are represented by the existence and non-existence of the high frequency oscillation.

FIG. 4 shows a third embodiment of the invention in which the logic circuit comprises first and second Gunn effect elements 41 and 42 which respectively have input electrodes 43 and 44 and output electrodes 45 and 46 capacitively coupled to the bulk effect elements, respectively. Capacitive element 25 and 26 are employed to shunt the Gunn effect elements 41 and 42, as in the embodiment of FIG. 3. A power source $Eo$ is connected across the series circuit of the Gunn effect elements 41 and 42. Specifically, the input and output electrodes of the Gunn effect elements 41 and 42 are attached to the semiconductor crystal which serves as the path of the high field domain. Gunn effect element has an input terminal 43 and an output terminal 45, and Gunn effect element 42 has an input terminal 44 and an output terminal 46. A dielectric thin film, such as a silicon oxide film, silicon nitride film, aluminum oxide film, barium titanate film, or the like, may be formed beneath these electrodes. A high frequency output is derived from the output electrodes. Similar to the foregoing embodiment shown in FIG. 3, bistable operation can be obtained from the circuit of FIG. 4. The operation of the embodiment of FIG. 4 is illustrated in FIGS. 5(A) through 5(D), wherein the variation in the input pulse and the voltage across the capacitive element is shown. The abscissa represents time $t$, and the ordinates respectively indicate the input pulse voltage $V_{T1}$ of the first Gunn effect element, the input pulse voltage $V_{T2}$ of the second Gunn effect element, the voltage $V_{C1}$ across the capacitive element connected in parallel with the first Gunn effect element, and voltage $V_{C2}$ across the capacitive element connected in parallel with the second Gunn effect element. These Gunn effect elements are initially biased to voltages $Vo_1$ and $Vo_2$, respectively, which are lower than the threshold values for these elements. Accordingly, both the Gunn effect elements 41 and 42 are initially in the non-oscillation state. When a trigger pulse 51 is applied to the input terminal 43 of the first Gunn effect element 41 at time point $t_1$, the voltage $V_{C1}$ across the capacitive element 25 connected in parallel with the Gunn effect element 41 is increased as shown by the curve 52. Thus, at time $t_2$, the element 41 begins self-maintained oscillation. This self-holding of oscillation continues until time $t_4$. A trigger pulse 53 is applied to the input terminal 44 of second Gunn effect element 42 at time $t_3$, and the voltage $V_{C2}$ across the capacitive element 26 connected in parallel with Gunn effect element 42 is increased as shown by the curve 54. As a result, the voltage $V_{C1}$ is decreased along the curve 52 to become equal to the threshold value $V_{th}$ at time $t_4$. The second Gunn effect element 42 is put into an oscillation state in response to the trigger pulse 53 at time $t_5$, when the voltage across the capacitive element 26 exceeds the threshold value. In the embodiments of FIGS. 3 and 4, the switching times $t_4$ and $t_5$ become nearly coincident with each other when the following relationship exists among the bias voltages $Vo_1$, $Vo_2$ and threshold value $V_{th}$:

$$Vo_1=Vo_2\cong V_{th}.$$

When the bias voltages $Vo_1$ and $Vo_2$ are increased, and when the relationship between the two Gunn effect elements is expressed by $$Vo_1=Vo_2<2V_{th},$$

the noise margin in the circuits of the second and third embodiments are reduced gradually. The bistable function is lost under the condition expressed by $Vo_1=Vo_2>2V_{the}$ (when Gunn effect elements of identical characteristics are used)

or, $Vo_1+Vo_2>2V_{th}$ (when Gunn effect elements of different characteristics are used)

To utilize these circuit arrangements as a multivibrator, it is necessary that at least one of the Gunn effect elements is in the nonoscillation state, that the bias voltages $Vo_1$ and $Vo_2$ are determined so that the element which is in the non-oscillation state is placed in the oscillation state by an input pulse, and that the Gunn effect element under oscillation state is restored to the non-oscillation state by applying the trigger pulse to the other Gunn effect element in the non-oscillation state.

FIGS. 6 and 7 illustrate a thin film circuit substrate incorporating the third circuit embodiment of the invention illustrated in FIG. 4. This circuit comprises metallic wirings 62 and 63 for connection to an external power supply formed by applying a metallizing process to the surface of an insulative ceramic plate 61. Similarly, an intermediate connection metallic layer 64, and electrode metallic wirings 65, 65', 66 and 66' for leading out input and output electrodes from the Gunn effect elements 41 and 42, are attached to the plate 61. Dielectric films 67 and 68 formed of such materials as barium titanate, tantalum oxide, aluminum oxide, or the like, are deposited onto a part of the intermediate metallic wiring 64 by the anode oxidizing method, sputter method or vapor deposition method. Metallic wirings 69 and 69' connected to the power source metallic wirings 62 and 63 are disposed on the surface of the dielectric bodies 66 and 68, respectively. The Gunn effect elements 41 and 42 are bonded to the surfaces of the metallic wirings 62, 63 and 64. As shown in FIG. 6, one of the parallel connections of the Gunn effect element 41 and the capacitor using the dielectric film 67, and the other of the parallel connections of the Gunn effect element 42 and the capacitor using dielectric film 68 are disposed between the power source metallic wirings 62 and 63 in the same manner as shown in FIG. 4. The thin film circuit formed in the above manner makes highly reliable operation possible.

In the foregoing embodiments, besides the intermetallic semiconductor such as gallium arsenide, germanium having the capture center, or piezoelectric semiconductor may be used as the semiconductor crystal which brings about the Gunn effect. Also, the auxiliary electrode for supplying trigger pulse may be disposed therein for connection to the Gunn effect element by way of ohmic contact, capacitive coupling, or rectifying contact.

While a few embodiments of the invention have been illustrated and described in detail, it should understood that the invention is not limited thereto or thereby.

What is claimed is:

1. A semiconductor logic device comprising a Gunn effect element having a pair of electrodes capable of generating high frequency oscillation in response to an energizing voltage above a threshold value; a load element having one terminal connected to one of the electrodes of said Gunn effect element, capacitive means connected in shunt across said Gunn effect element and said load element, an impedance element having one terminal connected to the other terminal of said load element, a power source connected to the other terminal of said impedance element and to the other electrode of said Gunn effect element for supplying to said Gunn effect element a bias voltage lower than said threshold value, and triggering means operatively connected to said Gunn effect element for producing a high field domain in said Gunn effect element, whereby the mean internal impedance of said Gunn effect element is increased and the voltage across said capacitive means exceeds said threshold value to maintain high frequency oscillation of said Gunn effect element after the termination of operation of said triggering means, the high frequency output of said Gunn effect element being taken across said load element.

2. The logic device of claim 1, further comprising a resistance element connected in series with said power source and said impedance element and defining a junction point at its connection with the latter, said capacitive means being connected to said junction point and to the other of said electrodes.

3. The logic device of claim 1, in which said impedance element is a resistor.

4. The logic device of claim 1, in which said impedance element is another Gunn effect element.

5. The logic device of claim 4, further comprising another capacitive means connected in shunt across said another Gunn effect element and another triggering means coupled to said another Gunn effect element.

* * * * *